(12) United States Patent
Mak et al.

(10) Patent No.: US 9,252,089 B2
(45) Date of Patent: Feb. 2, 2016

(54) UNIVERSAL LEAD FRAME FOR FLAT NO-LEADS PACKAGES

(71) Applicant: Infineon Technologies AG, Neubiberg (DE)

(72) Inventors: Chee Hoe Mak, Durian Tunggal (MY); Ryan Ross Alinea, Las Pinas (PH); Yun Yann Ng, Sungai Rambai (MY); Norliza Morban, Kg. Pernu (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/254,999

(22) Filed: Apr. 17, 2014

(65) Prior Publication Data

US 2015/0303134 A1    Oct. 22, 2015

(51) Int. Cl.
| | |
|---|---|
| *H01L 23/495* | (2006.01) |
| *H01L 21/48* | (2006.01) |
| *H01L 21/78* | (2006.01) |
| *H01L 21/56* | (2006.01) |
| *H01L 23/00* | (2006.01) |
| *C23F 1/00* | (2006.01) |

(52) U.S. Cl.
CPC ............ *H01L 23/49541* (2013.01); *C23F 1/00* (2013.01); *H01L 21/4828* (2013.01); *H01L 21/4842* (2013.01); *H01L 21/565* (2013.01); *H01L 21/78* (2013.01); *H01L 24/83* (2013.01); *H01L 24/96* (2013.01); *H01L 2224/8385* (2013.01); *H01L 2224/83801* (2013.01)

(58) Field of Classification Search
USPC .......................... 257/666, E23.032, E21.506, 257/E23.005–E23.009, E23.041, E23.053, 257/E23.055; 438/111, 112, 123
See application file for complete search history.

(56) References Cited

U.S. PATENT DOCUMENTS

| | | | | |
|---|---|---|---|---|
| 2008/0067649 | A1* | 3/2008 | Matsunaga | H01L 21/4832 257/677 |
| 2008/0191324 | A1* | 8/2008 | Qiao | H01L 21/4828 257/666 |
| 2012/0061808 | A1* | 3/2012 | Liao | H01L 21/4832 257/666 |
| 2015/0076675 | A1* | 3/2015 | Real | H01L 23/49548 257/676 |
| 2015/0102476 | A1* | 4/2015 | Zhu | H01L 23/49579 257/676 |

* cited by examiner

*Primary Examiner* — Dao H Nguyen
*Assistant Examiner* — Tram H Nguyen
(74) *Attorney, Agent, or Firm* — Murphy, Bilak & Homiller, PLLC

(57) ABSTRACT

A universal lead frame for semiconductor packages includes a solid lead frame sheet comprising an electrically conductive material and a plurality of columns etched into the lead frame sheet and distributed with a predetermined lead pitch so that the universal lead frame has a solid first main side opposite the columns and a patterned second main side opposite the first main side. A method of manufacturing the universal lead frame includes providing a solid lead frame sheet of an electrically conductive material and etching a plurality of columns into the lead frame sheet so that the columns are distributed with a predetermined lead pitch and the universal lead frame has a solid first main side opposite the columns and a patterned second main side opposite the first main side. A method of manufacturing molded semiconductor packages using the universal lead frame is also provided.

18 Claims, 6 Drawing Sheets

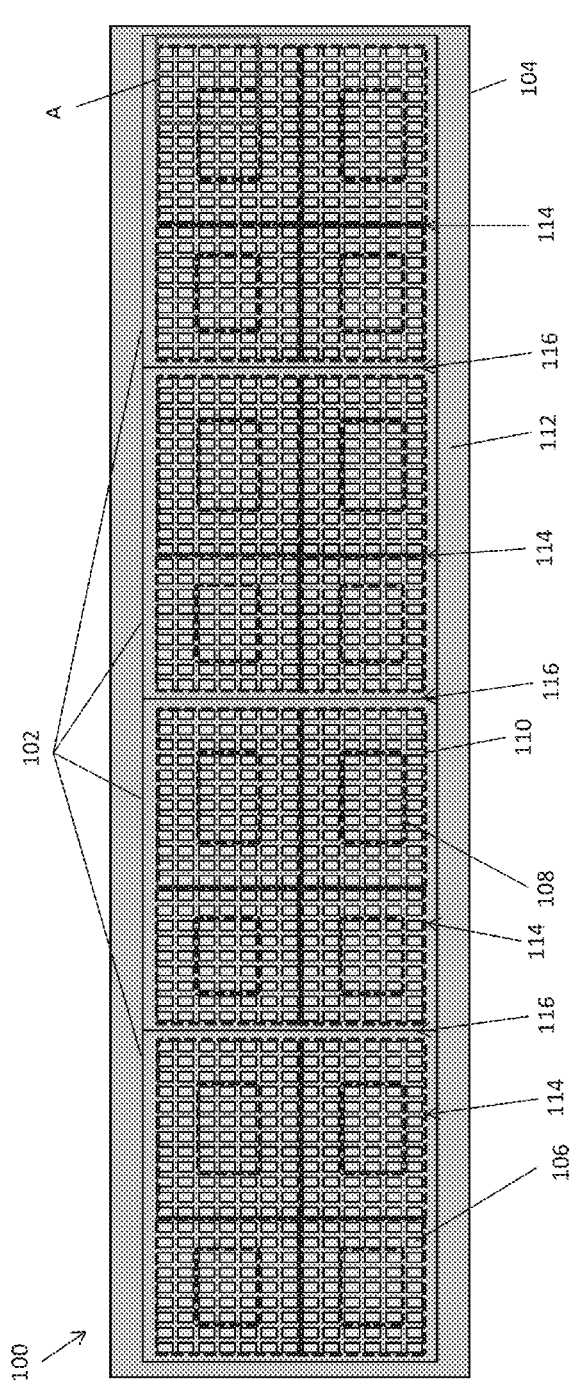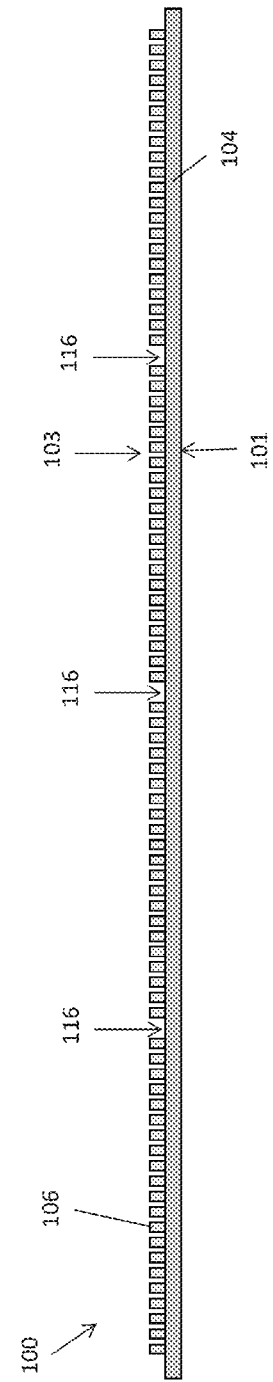

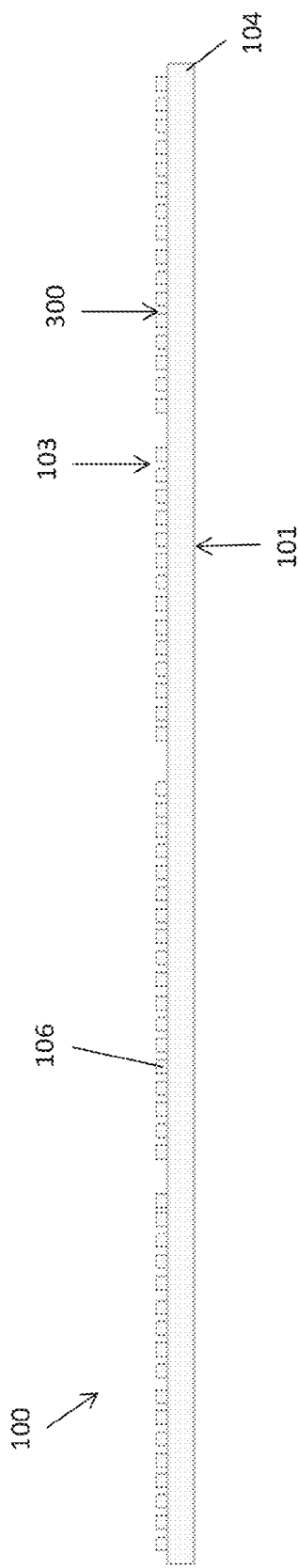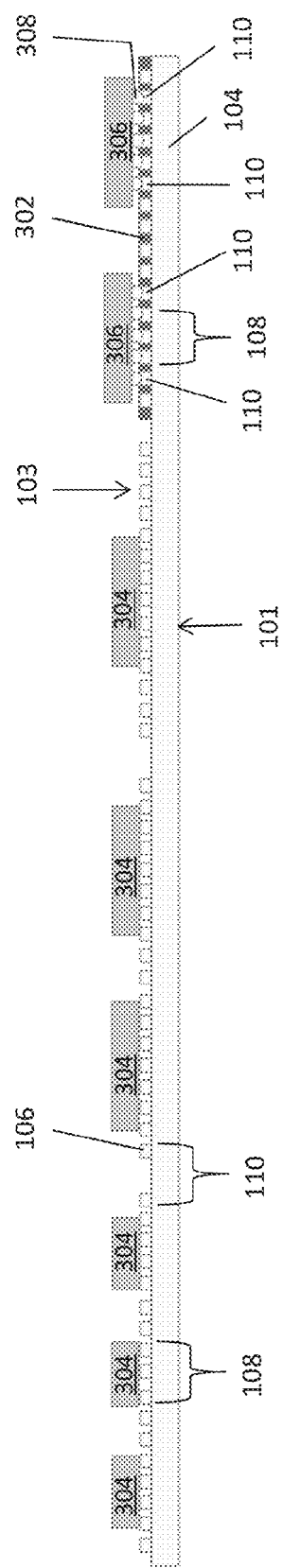
Figure 3A
Figure 3B

UNIVERSAL LEAD FRAME FOR FLAT NO-LEADS PACKAGES

TECHNICAL FIELD

The present application relates to flat no-leads packages, in particular lead frames for flat no-leads packages.

BACKGROUND

Flat no-leads packages such as QFN (quad-flat no-leads) and DFN (dual-flat no-leads) physically and electrically connect integrated circuits to boars such as printed circuit boards (PCBs). Flat no-leads, also known as micro leadframe (MLP) and SON (small-outline no leads), is a surface-mount technology for connecting ICs (integrated circuits) to the surfaces of PCBs without through-holes. Flat no-leads is a near-chip scale package technology that provides a plastic encapsulated package made with a planar copper lead frame substrate. Perimeter lands on the package bottom provide electrical connections to the PCB.

Lead frames for flat no-leads packages are conventionally customized based on specific lead count, exposed pad size and body size. For example, a first lead frame design is used for a 32 pin count QFN package having a 5×5 mm body size and exposed pad size of 3×3 mm and a different lead frame design is used for a 48 pint count QFN package having a 7×7 mm body size and exposed pad size of 5×5 mm. Having too many lead frame designs increases the package design and inventory costs in production, and increases part number management complexity.

SUMMARY

According to an embodiment of a universal lead frame for semiconductor packages, the universal lead frame comprises a solid lead frame sheet comprising an electrically conductive material and a plurality of columns etched into the lead frame sheet and distributed with a predetermined lead pitch so that the universal lead frame has a solid first main side opposite the columns and a patterned second main side opposite the first main side.

According to an embodiment of a method of manufacturing a universal lead frame for semiconductor packages, the method comprises providing a solid lead frame sheet comprising an electrically conductive material and etching a plurality of columns into the lead frame sheet so that the columns are distributed with a predetermined lead pitch and the universal lead frame has a solid first main side opposite the columns and a patterned second main side opposite the first main side.

According to an embodiment of a method of manufacturing molded semiconductor packages, the method comprises: providing a lead frame sheet comprising a plurality of columns etched into the lead frame sheet so that the lead frame sheet has a solid first main side opposite the columns and a patterned second main side opposite the first main side; attaching a plurality of semiconductor dies to a first group of the columns; connecting terminals of the semiconductor dies to a second group of the columns different than the first group; encapsulating the semiconductor dies and terminal connections with a molding compound; etching the solid first main side of the lead frame sheet to segment the solid lead frame sheet into leads and die pads, each die pad including a plurality of the columns in the first group and each lead including one or more of the columns in the second group; and cutting through the molding compound to form individual molded semiconductor packages.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes FIGS. 1A through 1D, illustrates different view of an embodiment of a universal lead frame.

FIG. 2, which includes

FIG. 3, which includes FIGS. 3A through 3H, illustrates different stages of an embodiment of a method of manufacturing molded semiconductor packages from a universal lead frame.

DETAILED DESCRIPTION

The embodiments described herein provide a universal lead frame for flat no-leads packages such as QFN and DFN. The universal lead frame design supports any package design having the same frame thickness and lead pitch, without having to provide multiple lead frame designs to support the entire package platform. Different footprints, body sizes and pin counts can be realized later by personalizing the universal lead frame during the package assembly process. The universal lead frame design can have the shortest possible wire length for better electrical performance (lower wire resistance), minimize the lead frame design process by providing a single universal lead frame of a defined thickness type and reduce the inventory cost for package platforms having different lead counts (e.g. 32, 48, etc.), body sizes (e.g. 5×5 mm, 7×7 mm, etc.) and exposed pad sizes (e.g. 3×3 mm, 5×5 mm, etc.).

Figure 1D:
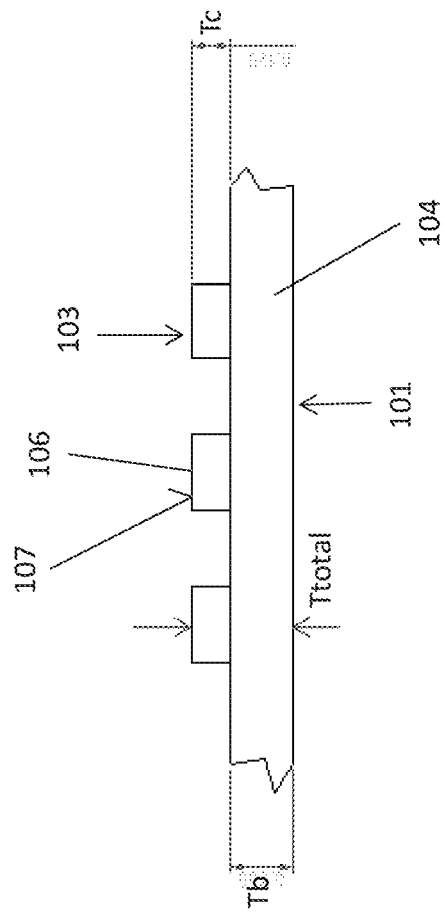
Figure 1C:
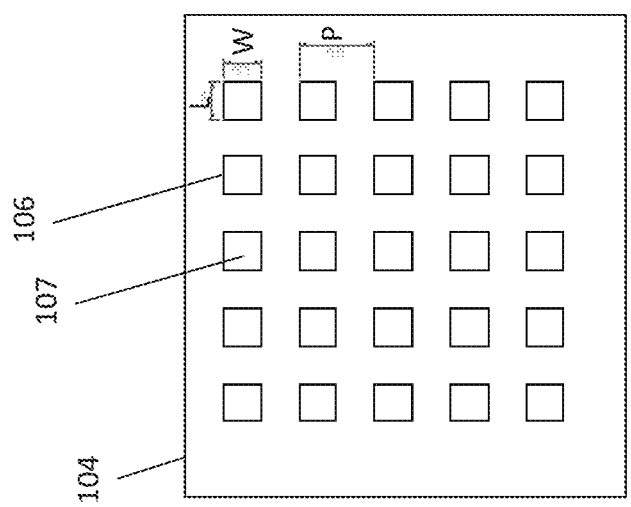

FIG. 1, which includes FIGS. 1A through 1D, illustrates an embodiment of a universal lead frame 100 for flat no-leads packages such as QFN and DFN. FIG. 1A shows a top-down plan view of the universal lead frame 100 and FIG. 1B shows a side view of the universal lead frame 100. FIG. 10 shows an exploded top-down plan view of the part of the universal lead frame labeled 'A' in FIG. 1A and FIG. 1D shows a corresponding side view. The universal lead frame 100 is shown as a four panel design as an example, but can include any number of panels 102 (1, 2, 3, 4, etc.).

The universal lead frame 100 comprises a solid lead frame sheet 104 comprising an electrically conductive material e.g. a copper film, a copper-molybdenum compound, a copper alloy such as copper-nickel-tin alloy, an nickel-iron alloy such as 42 alloy, ASTM F-15 alloy (consisting of 29% nickel, 17% cobalt and balance iron), pure nickel, etc. The lead frame sheet 104 can be plated e.g. with NiPdAu, Ag, Cu, etc. The lead frame sheet 104 is solid in that the lead frame sheet 104 is not interrupted by a break or opening i.e. leads and die pads are not stamped or etched into the lead frame sheet 104 prior to the package assembly process. As such, the lead frame sheet 104 enters the package assembly process without leads and die pads which are formed later in the process.

The universal lead frame 100 also comprises a plurality of columns (islands) 106 etched into the lead frame sheet 104. This way, the universal lead frame 100 has a solid bottom side 101 opposite the columns 106 and a patterned top side 103 opposite the bottom side 101. During later package assembly, semiconductor dies are attached to a first (e.g. inner) group 108 of the columns 106 and the terminals of the semiconductor dies are connected to a second (e.g. outer) group 110 of the columns 106 different than the first group 108. The final package footprint is realized during package assembly with an additional etching process directed at the solid bottom side 101 of the universal lead frame 100.

Each column 106 has a defined length (L), width (W) and thickness (Tc) as shown in FIGS. 1C and 1D. The top surface 107 of the columns 106 can have a square shape as shown in FIG. 1C, rectangular shape, circular shape, oval shape, or any other desired shape. The columns 106 can have approximately the same length, width and thickness i.e. within tolerances of the etching process used to form the columns 106. In one embodiment, the columns 106 have a thickness of approximately 1 µm to 5 µm. In other embodiments, the thickness of the columns 106 is outside this range. The columns 106 can comprises one or more materials. For example, the columns 106 can comprise a thicker (core) copper material and a thinner outer metallization plating of Aluminum/NiPdAu, etc. The columns 106 can comprise any material system sufficient for adhering to the molding compound to be provided later. The thickness of each column 106 corresponds to the amount of material removed from unmasked/unprotected parts of the top side 103 of the solid lead frame sheet 104 during the etching process. The etched part of the solid lead frame sheet 104 has a solid thickness Tb and the un-etched part of the solid lead frame sheet 104 has a thickness Ttotal=Tb+Tc.

The columns 106 can be distributed in an array with a predetermined lead pitch (P) i.e. a predetermined distance between adjacent leads of a package. The predetermined lead pitch can satisfy a standardized lead pitch such as specified in the JEDEC outline MO-220 standard. For example, the predetermined lead pitch can be 0.65 mm, 0.5 mm or 0.4 mm. Other predetermined lead pitches can also be used which may or may not satisfy a standardized lead pitch. That is, the lead pitch for the columns 106 can be a standard lead pitch or a customized lead pitch. In either case, an outer periphery 112 of the lead frame sheet 104 can be devoid of the columns 106 and the columns 106 are arranged in uniformly spaced groups 114. The groups 114 of columns 106 are spaced apart from one another by a region 116 of the lead frame sheet devoid 104 of the columns 106. Such a region 116 can correspond to the space between panels 102 in the case of a multi-panel universal lead frame.

Figure 2A:
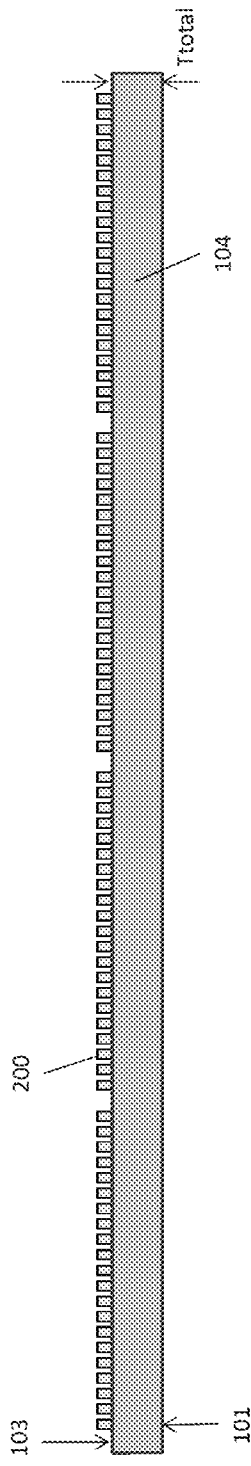
FIGS. 2A through 2C, illustrates different stages of an embodiment of a method of manufacturing a universal lead frame.
Figure 2B:
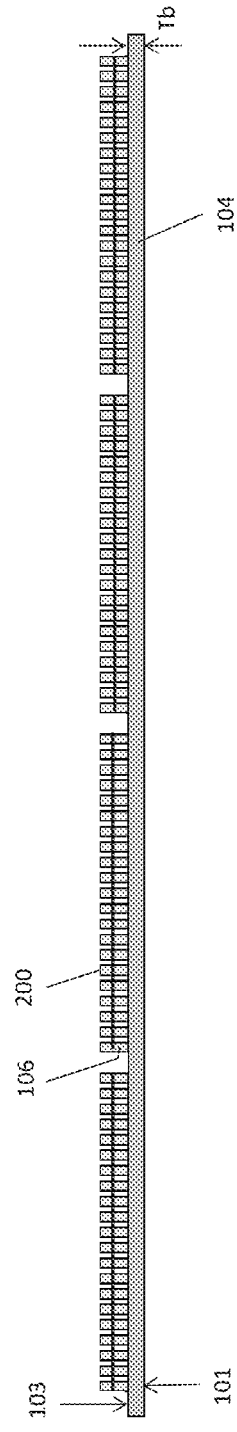
Figure 2C:
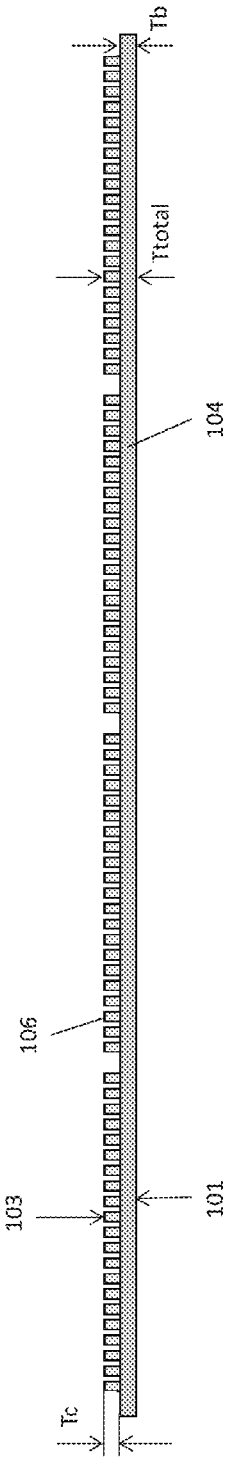

FIG. 2, which includes FIGS. 2A through 2C, illustrates an embodiment of a method of manufacturing the universal lead frame 100. The method includes providing a solid lead frame sheet 100 having a bottom side 101 and a top side 103. The lead frame sheet 100 comprises an electrically conductive material e.g. a copper film, a copper-molybdenum compound, a copper alloy such as copper-nickel-tin alloy, an nickel-iron alloy such as 42 alloy, ASTM F-15 alloy (consisting of 29% nickel, 17% cobalt and balance iron), pure nickel, etc. as shown in FIG. 2A. The lead frame sheet 100 can be plated e.g. with NiPdAu, Ag, Cu, etc. Columns 106 can be etched into the solid lead frame sheet 100 by photochemical etching. For example, the top surface 103 of the lead frame sheet 100 can be coated with photoresist. The top surface 103 of the lead frame sheet 100 can then be cleaned, followed by lamination if desired. The photoresist is then exposed to the desired column array pattern e.g. with the aid of an ultraviolet source and a precision pattern glass/film photomask. The photomask can be generated by converting a customer drawing (artwork file) into a single-strip master mask or multi-strip production mask. In each case, the regions of the lead frame sheet 100 which are to remain un-etched are coated with the exposed resist 200 and the regions of the lead frame sheet 100 to be etched are free of the exposed resist 200 as shown in FIG. 2A. The pattern of the exposed resist 200 defines the length, width and pitch of the columns 106 to be etched into the top surface 103 of the lead frame sheet 100.

A chemical etchant such as an acid is then directed at the exposed regions of the lead frame sheet 100 to etch columns 106 into the top surface 103 of the lead frame sheet 100. The thickness (Tc) of the columns 106 depends on the duration of the etch process. In one embodiment, the chemical etchant is directed at the exposed regions of the lead frame sheet 100 for a long enough period of time so that the columns 106 have a thickness Tc of approximately 1 µm to 5 µm after the chemical etching process is complete.

The exposed resist 200 is then removed using any standard photoresist removal process as shown in FIG. 2C. The thickness of the columns 106 corresponds to the amount of material removed from the unmasked/unprotected regions of the top surface 103 of the solid lead frame sheet 100 during the chemical etching process. The etched part of the solid lead frame sheet 100 has a solid thickness Tb and the un-etched part of the solid lead frame sheet 100 has a thickness Ttotal=Tb+Tc as previously described herein.

Instead of a chemical etching process, the columns 106 can be formed by laser or water jet etching of the top surface 103 of the solid lead frame sheet 100 where the energy and duration of the lasing/water jet process determines the thickness Tc of the columns 106. The minimum width, length and pitch of the columns 106 is a function of the precision of the lasing/water jet process in the case of laser/water jet etching of the columns 106 or of the minimum photolithographic feature size in the case of chemical etching of the columns 106. In either case, the columns 106 can be etched into the lead frame sheet 100 so that the columns 106 are distributed in an array having a predetermined lead pitch and so that the universal lead frame has a solid bottom side 101 opposite the columns 106 and the patterned top side 103.

The universal lead frame is dimensioned to be received by semiconductor packaging equipment i.e. any equipment used to assemble semiconductor packages from a lead frame, including equipment such as die attach equipment, wire bond equipment and molding equipment.

Figure 3C:
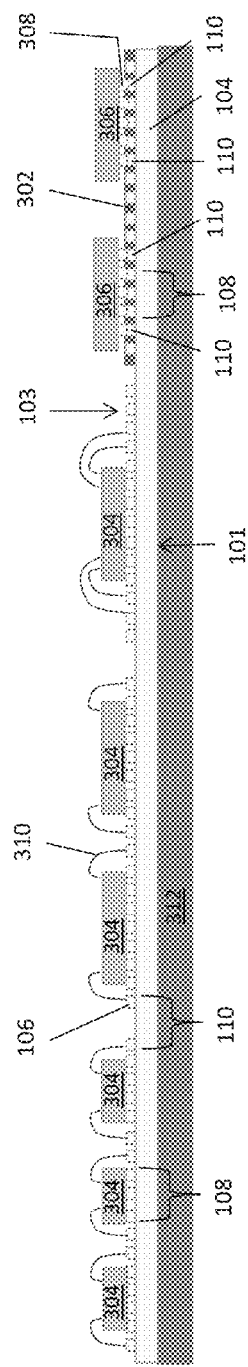

FIG. 3, which includes FIGS. 3A through 3H, illustrates an embodiment of a method of manufacturing molded semiconductor packages from a universal lead frame. The method includes providing a universal lead frame 100 comprising a lead frame sheet 104 having a plurality of columns 106 etched into the lead frame sheet 104 so that the lead frame sheet 104 has a solid bottom side 101 opposite the columns 106 and the patterned top side 103 as shown in FIG. 3A. The lead frame 100 is considered to be universal in that different die sizes, different wire layouts, different package footprints, and flip-chip processes can be supported using the same lead frame design.

FIG. 3B shows the manufacturing method after a plurality of semiconductor dies 304, 306 are attached to a first (e.g. inner) group of the columns 106. The semiconductor dies 304, 306 can be attached to the first group 108 of columns 106 by any standard die attach material such as solder, glue or die attach film. The backside of the dies 304, 306 attached to the columns 106 in the first group 108 can be electrically active or inactive. In the case of an electrically inactive backside, a thermally conductive adhesive such as a die attach film can be used to attach the dies 304, 306 to the columns 106 in the first group 108. The epoxy of the die attach film is cured and the lead frame sheet 104 can be cleaned e.g. by a standard plasma clean process.

In the case of solder attachment, the inter-column gaps 300 can be filled with an epoxy or other standard underfill 302 before or after soldering the semiconductor dies 304, 306 to the first group 108 of columns 106. For example, a flip-chip process can be used to attach some or all of the dies 306 to the first group 108 of columns 106 as shown in the right-hand side of FIG. 3B. In this case, solder bumps 308 deposited on pads of the flip-chip dies 306 are used to attach the flip-chip dies 306 to different columns 106 of the universal lead frame 100. In the case of a die attach film, the inter-column gaps 300 can remain unfilled as shown in the left-hand side of FIG. 3B.

In each case, terminals of the semiconductor dies 304, 306 are connected to a second group 110 of the columns 106 different than the first group 106. In the case of the flip-chip dies 306 shown in the right-hand side of FIG. 3C, both the first and second groups 108, 110 of columns 106 are disposed under the dies 306. For the flip-chip dies 306, all die terminals (electrical and thermal terminals) are soldered to the columns 106 disposed under the dies 306 by solder bumps 308. In the case of the other (non-flip-chip) dies 304 shown in the left-hand side of FIG. 3C, the first group 108 of columns 106 is disposed under the dies 304 and the second group 110 of columns 106 is laterally spaced apart from and uncovered by the dies 304. The terminals of these dies 304 can be attached to the second group 110 of columns 106 by wire bonds 310 as shown in FIG. 3C, wire ribbons, metal clips, etc. In each case, the solid bottom side 101 of the lead frame sheet 104 can be heated during the terminal attach process.

In one embodiment, a solid heater block 312 adjacent the solid bottom side 101 of the lead frame sheet 104 heats the lead frame sheet 104 while the terminals of the semiconductor dies 304, 306 are connected to the second group 110 of the columns 106. The heater block 312 is solid i.e. not interrupted by a break or opening because the bottom side 101 of the lead frame sheet 104 is also solid. If the bottom side 101 of the lead frame sheet 104 were instead etched or stamped into a pattern of leads and die pads, the heater block 312 could not be a solid block but instead must be carefully designed to support such a structured lead frame sheet. The solid heater block 312 is a much simpler and less costly approach.

Figure 3D:
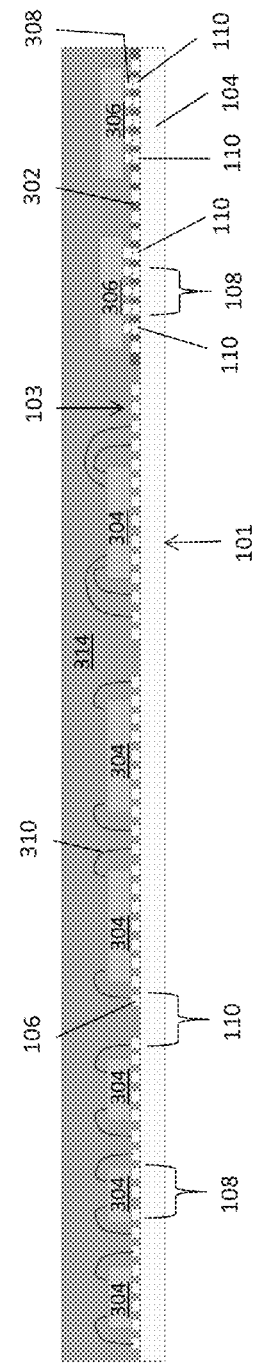

The semiconductor dies 304, 406 and terminal connections are then encapsulated with a molding compound 314 as shown in FIG. 3D. Any standard molding process can be used.

Figure 3E:
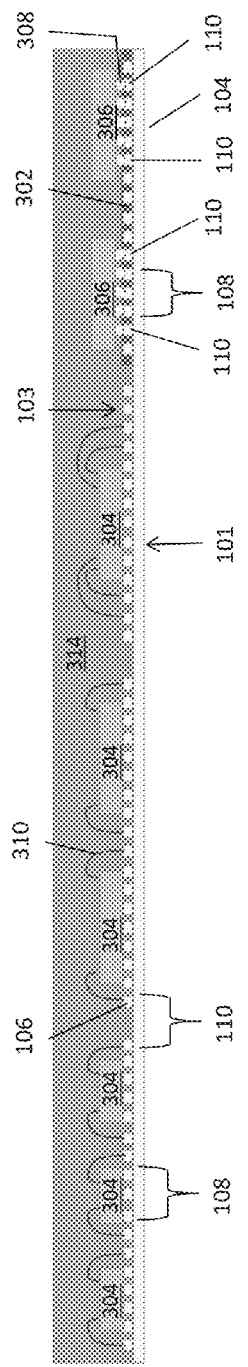

The solid bottom side 101 of the lead frame sheet 104 can be thinned as shown in FIG. 3E. Any standard lead frame thinning process can be used.

Figure 3G:
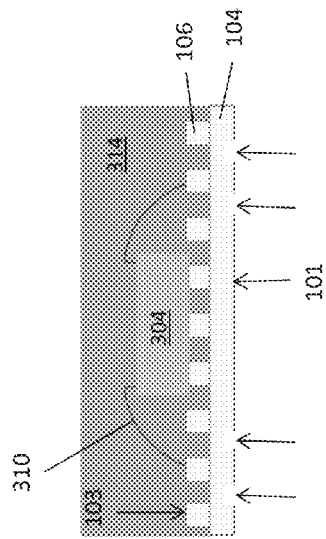
Figure 3F:

The solid bottom side 101 of the lead frame sheet 104 is then etched to segment the solid lead frame sheet into leads and die pads. Each die pad includes a plurality of the columns 106 in the first group 108 and each lead includes one or more of the columns 106 in the second group 110. FIG. 3F shows a portion of the assembly during one embodiment of etching. According to this embodiment, an etch mask 316 such as developed photoresist is formed on the solid bottom side 101 of the lead frame sheet 104 and a chemical etchant such as acid is applied to regions of the bottom side 101 of the lead frame sheet 104 uncovered by the etch mask 316 as indicated by the upward facing arrows in FIG. 3F. FIG. 3G shows a portion of the assembly during another embodiment of etching. According to this embodiment, the solid lead frame sheet 104 is segmented into leads and die pads by laser or water jet etching of the solid bottom side 101 as indicated by the upward facing arrows.

In each case, the columns 106 in the second group 110 can define a lead footprint of the molded semiconductor packages and be distributed with a predetermined lead pitch required for the leads of the molded semiconductor packages. As such, the leads etched into the solid bottom side of the lead frame sheet can have the same dimensions (width, length, pitch) as the columns 106 in the second group 110 and each lead includes one of the columns 106 in the second group 110. In one embodiment, the predetermined lead pitch of the columns 106 in the second group 110 satisfies a standardized lead pitch such as specified in the JEDEC outline MO-220 standard. For example, the predetermined lead pitch can be 0.65 mm, 0.5 mm or 0.4 mm. In another embodiment, the spacing of the columns 106 in the second group 110 does not define the lead pitch of the molded semiconductor packages. Instead, the lead pitch is defined by the spacing of the leads etched into the solid bottom side 101 of the lead frame sheet 104. That is, the etching of the solid bottom side 101 of the lead frame sheet 104 defines the lead footprint of the molded semiconductor packages and the predetermined lead pitch required for the leads of the molded semiconductor packages. According to this embodiment, each lead can include one or more of the columns 106 in the second group 110. In general, the lead pitch of the molded semiconductor packages may or may not satisfy a standardized lead pitch. That is, the lead pitch of the molded semiconductor packages can be a standard lead pitch or a customized lead pitch.

Figure 3H:
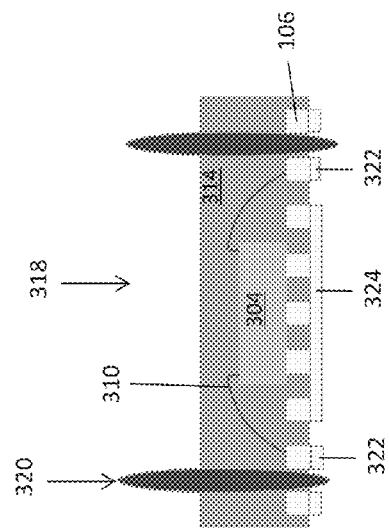

The molding compound 314 is then cut through to form individual molded semiconductor packages 318 one of which is shown in FIG. 3H. Any standard package singulation process such as sawing 320 can be used to separate the individual packages 318. FIG. 3H also shows the etched bottom side 101 of the lead frame sheet 104, which was previously segmented into leads 322 and die pads 324. Each die pad 324 includes a plurality of the columns 106 in the first group 108 and each lead 322 includes one or more of the columns 106 in the second group 110 as previously described herein.

Spatially relative terms such as "under", "below", "lower", "over", "upper" and the like, are used for ease of description to explain the positioning of one element relative to a second element. These terms are intended to encompass different orientations of the package in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A universal lead frame for semiconductor packages, comprising:

a solid lead frame sheet comprising an electrically conductive material; and a plurality of columns etched into the lead frame sheet and distributed with a predetermined lead pitch so that the universal lead frame has a solid first main side opposite the columns and a patterned second main side opposite the first main side, wherein an outer periphery of the lead frame sheet is devoid of the columns, and wherein the columns are arranged in groups of uniformly spaced columns, the groups of columns being spaced apart from one another by a region of the lead frame sheet devoid of the columns.

2. The universal lead frame of claim 1, wherein the predetermined lead pitch is one of 0.65 mm, 0.5 mm or 0.4 mm.

3. The universal lead frame of claim 1, wherein the columns have approximately the same length, width and thickness.

4. The universal lead frame of claim 1, wherein the columns have a thickness of approximately 1 µm to 5 µm.

5. A method of manufacturing a universal lead frame for semiconductor packages, the method comprising:

providing a solid lead frame sheet comprising an electrically conductive material; and etching a plurality of columns into the lead frame sheet so that the columns are distributed with a predetermined lead pitch and the universal lead frame has a solid first main side opposite the columns and a patterned second main side opposite the first main side, wherein the columns are etched into the lead frame sheet so that an outer periphery of the lead frame sheet is devoid of the columns and the columns are arranged in groups of uniformly spaced columns, the groups of columns being spaced apart from one another by a region of the lead frame sheet devoid of the columns.

6. The method of claim 5, wherein the columns are etched into the lead frame sheet so that the columns are distributed with a predetermined lead pitch of 0.65 mm, 0.5 mm or 0.4 mm.

7. The method of claim 5, wherein the columns are etched into the lead frame sheet so that the columns have approximately the same length, width and thickness.

8. The method of claim 5, wherein etching the columns into the lead frame sheet comprises:

etching the solid lead frame sheet for a long enough period of time so that the columns have a thickness of approximately 1 µm to 5 µm after the etching is complete.

9. A method of manufacturing molded semiconductor packages, the method comprising:

providing a lead frame sheet comprising a plurality of columns etched into the lead frame sheet so that the lead frame sheet has a solid first main side opposite the columns and a patterned second main side opposite the first main side;

attaching a plurality of semiconductor dies to a first group of the columns;

connecting terminals of the semiconductor dies to a second group of the columns different than the first group;

heating the solid first main side of the lead frame sheet with a solid heater block adjacent the solid first main side while connecting the terminals of the semiconductor dies to the second group of the columns;

encapsulating the semiconductor dies and terminal connections with a molding compound;

etching the solid first main side of the lead frame sheet to segment the solid lead frame sheet into leads and die pads, each die pad including a plurality of the columns in the first group and each lead including one or more of the columns in the second group; and cutting through the molding compound to form individual molded semiconductor packages.

10. The method of claim 9, further comprising filling gaps between the columns before the semiconductor dies are attached to the first group of the columns.

11. The method of claim 9, wherein etching the solid first main side of the lead frame sheet to segment the solid lead frame sheet into leads and die pads comprises:

forming an etch mask on the solid first main side of the lead frame sheet; and applying an etchant to regions of the solid first main side of the lead frame sheet uncovered by the etch mask.

12. The method of claim 9, wherein the solid lead frame sheet is segmented into leads and die pads by laser or water jet etching of the solid first main side.

13. The method of claim 9, wherein the semiconductor dies are attached to the first group of the columns by solder, glue or die attach film.

14. The method of claim 9, wherein the columns in the second group define a lead footprint of the molded semiconductor packages and are distributed with a predetermined lead pitch required for the leads of the molded semiconductor packages.

15. The method of claim 14, wherein the predetermined lead pitch is 0.65 mm, 0.5 mm or 0.4 mm.

16. The method of claim 9, wherein the etching of the solid first main side of the lead frame sheet defines a lead footprint of the molded semiconductor packages and a predetermined lead pitch required for the leads of the molded semiconductor packages.

17. The method of claim 9, wherein the columns are uniformly spaced and have approximately the same length, width and thickness.

18. A method of manufacturing molded semiconductor packages, the method comprising:

providing a lead frame sheet comprising a plurality of columns etched into the lead frame sheet so that the lead frame sheet has a solid first main side opposite the columns and a patterned second main side opposite the first main side, wherein the columns are etched into the lead frame sheet so that an outer periphery of the lead frame sheet is devoid of the columns and the columns are arranged in groups of uniformly spaced columns, the groups of columns being spaced apart from one another by a region of the lead frame sheet devoid of the columns;

attaching a plurality of semiconductor dies to a first group of the columns;

connecting terminals of the semiconductor dies to a second group of the columns different than the first group;

encapsulating the semiconductor dies and terminal connections with a molding compound;

etching the solid first main side of the lead frame sheet to segment the solid lead frame sheet into leads and die pads, each die pad including a plurality of the columns in the first group and each lead including one or more of the columns in the second group; and cutting through the molding compound to form individual molded semiconductor packages.

* * * * *